(12) United States Patent
Oda et al.

(10) Patent No.: US 6,723,183 B2
(45) Date of Patent: Apr. 20, 2004

(54) SILICIDE TARGET FOR DEPOSITING LESS EMBRITTLING GATE OXIDE AND METHOD OF MANUFACTURING SILICIDE TARGET

(75) Inventors: Kunihiro Oda, Ibaraki-ken (JP); Hirohito Miyashita, Ibaraki-ken (JP)

(73) Assignee: Nikko Materials Company, Limited, Tokyo (JP)

( * ) Notice: Subject to any disclaimer, the term of this patent is extended or adjusted under 35 U.S.C. 154(b) by 114 days.

(21) Appl. No.: 09/980,946

(22) PCT Filed: Mar. 23, 2001

(86) PCT No.: PCT/JP01/02410

§ 371 (c)(1),
(2), (4) Date: Dec. 5, 2001

(87) PCT Pub. No.: WO01/99176

PCT Pub. Date: Dec. 27, 2001

(65) Prior Publication Data

US 2002/0179195 A1 Dec. 5, 2002

(30) Foreign Application Priority Data

Jun. 19, 2000 (JP) .......................................... 2000/183143
Aug. 4, 2000 (JP) .......................................... 2000/236538

(51) Int. Cl.⁷ .......................... C22C 27/00; C22C 16/00
(52) U.S. Cl. ............. 148/421; 148/668; 148/DIG. 158; 420/422; 420/578
(58) Field of Search ................. 148/668, 421, 148/DIG. 158; 420/422, 578

(56) References Cited

U.S. PATENT DOCUMENTS 5,354,446 A   10/1994   Kida et al. ............. 204/298.22
5,903,053 A * 5/1999   Iijima et al. ................. 257/751

FOREIGN PATENT DOCUMENTS

JP      5-214526       8/1993
JP      11-135774      5/1999
JP      2000080468 A  * 3/2000 ........... C23C/14/34

OTHER PUBLICATIONS

Tay et al. "A Comparison of the Bulk Resistivity as a Function of Composition for Some Group IVA–Boron and Silicon Systems", Journal of Electronic Materials, 16(2), 107–10, 1987.*

Patent Abstracts of Japan, English Abstract of JP 11–135774.

T. Matsuo et al., "Application of Zirconium Silicon Oxide Films to an Attenuated Phase–Shifting Mask in ArF Lithography", *Microprocesses and Nanotechnology Conference, 1999 Digest of Papers*, pp. 228–229, Jul. 1999.

W. Qi et al., "Performance of MOSFETs with Ultra Thin $ZrO_2$ and Zr Silicate Gate Dielectrics", *2000 Symposium on VLSI Technology Digest of Technical Papers*, pp. 40–41, Jun. 2000.

* cited by examiner

*Primary Examiner*—Andrew L. Oltmans
(74) *Attorney, Agent, or Firm*—Howson and Howson

(57) ABSTRACT

The present invention relates to a non-brittle silicide target for forming a gate oxide film made of $MSi_{0.8-1.2}$ (M: Zr, Hf), and provides a non-brittle silicide target suitable for forming a $ZrO_2 \cdot SiO_2$ film or $HfO_2 \cdot SiO_2$ film that can be used as a high dielectric gate insulating film having properties to substitute an $SiO_2$ film.

16 Claims, No Drawings

SILICIDE TARGET FOR DEPOSITING LESS EMBRITTLING GATE OXIDE AND METHOD OF MANUFACTURING SILICIDE TARGET

FIELD OF THE INVENTION

The present invention relates to a non-brittle silicide target suitable for forming a $ZrO_2.SiO_2$ or $HfO_2.SiO_2$ film that can be used as a high dielectric gate insulating film.

BACKGROUND OF THE INVENTION

The thickness of a dielectric gate insulating film affects the performance of an MOS transistor significantly, and should be such that the boundary to the silicon substrate is electrically smooth, and the mobility of carriers does not deteriorate.

Heretofore, an $SiO_2$ film has been used as the gate insulating film, and this has been most excellent in boundary characteristics. An $SiO_2$ film has characteristics such that the thinner the $SiO_2$ film used as the gate insulating film is, the larger the number of carriers, i.e. electrons or holes is, thereby increasing the drain current.

For these reasons, the $SiO_2$ film has been thinned to lower current and voltage values within the extent not to cause dielectric breakdown. However, there is limitation in thinning such $SiO_2$ films, and when the thickness of the $SiO_2$ film is decreased to 2 to 3 nm or less, a tunnel current flows and the $SiO_2$ film cannot function as an insulating film.

On the other hand, although transistors have been downsized, this is meaningless as long as there is limitation in the thickness of the $SiO_2$ film that functions as a gate insulating film as described above, and the performance of transistors has not been improved.

Also, in order to lower the power voltage of an LSI to save power consumption, the gate insulating film must further be thinned. However, since there is a problem of the dielectric breakdown of the gate when the thickness of the $SiO_2$ film is 3 nm or less, decrease in film thickness itself has limitation.

For the above-described reasons, high dielectric gate insulating films are recently studied for substituting the $SiO_2$ film. The high dielectric gate insulating films of interest include a $ZrO_2.SiO_2$ film or $HfO_2.SiO_2$ film.

These high dielectric gate insulating films are characterized in that the capacity equivalent to the capacity of an $SiO_2$ film can be attained by a relatively thick film, and tunnel leakage current can be inhibited. Also, since these gate-insulating films can be considered to be $SiO_2$ films to which Zr or Hf is added, their interfacial characteristics can be expected to be similar to those of $SiO_2$.

Consequently, there is a need for a sputtering target that can produce a high-quality $ZrO_2.SiO_2$ or $HfO_2.SiO_2$ high dielectric gate insulating film easily and reliably.

OBJECT OF THE INVENTION

In order to solve the above-described problems, the object of the present invention is to provide a non-brittle silicide target suitable for forming a $ZrO_2.SiO_2$ or $HfO_2.SiO_2$ film that can be used as a high dielectric gate insulating film that has properties to substitute an $SiO_2$ film, and a method for manufacturing such a silicide target

SUMMARY OF THE INVENTION

According to a first embodiment of the present invention, there is provided a non-brittle silicide target for forming a gate oxide film made of $MSi_{0.8-1.2}$ (M: Zr, Hf).

According to a second embodiment of the present invention, there is provided the non-brittle silicide target for forming a gate oxide film according to the first embodiment, wherein no free Si is present.

According to a third embodiment of the present invention, there is provided the non-brittle silicide target for forming a gate oxide film according to the first or second embodiments, made of the single phase of MSi.

According to a fourth embodiment of the present invention, there is provided the non-brittle silicide target for forming a gate oxide film according to the first or second embodiments, made of a mixed phase of at least two selected from MSi, $M_5Si_4$, and $MSi_2$.

According to a fifth embodiment of the present invention, there is provided the non-brittle silicide target for forming a gate oxide film according to any of the first to fourth embodiments, wherein the relative density is 99% or more.

According to a sixth embodiment of the present invention, there is provided the non-brittle silicide target for forming a gate oxide film according to any of the first to fifth embodiments, wherein the average crystal grain diameter is 30 $\mu$m or less.

According to a seventh embodiment of the present invention, there is provided the non-brittle silicide target for forming a gate oxide film according to any of the first to fifth embodiments, wherein the average crystal grain diameter is 10 $\mu$m or less.

According to an eighth embodiment of the present invention, there is provided the non-brittle silicide target for forming a gate oxide film according to any of the first to seventh embodiments, wherein the transverse rupture strength thereof is 200 MPa or more.

According to a ninth embodiment of the present invention, there is provided a method for manufacturing a non-brittle silicide target for forming a gate oxide film consisting of $MSi_{0.8-1.2}$ (M: Zr, Hf), comprising the steps of mixing hydrogenated metal (M) powder and Si powder in a mole ratio of 1:0.8 to 1:1.2, and baking and sintering the mixture.

According to a tenth embodiment of the present invention, there is provided the method for manufacturing a non-brittle silicide target for forming a gate oxide film according to ninth embodiment, wherein dehydrogenation and silicide synthesis are carried out by heating during baking.

According to an eleventh embodiment of the present invention, there is provided the method for manufacturing a non-brittle silicide target for forming a gate oxide film according to the tenth embodiment, wherein baking is performed at a temperature between 600° C. and 800° C.

DETAILED DESCRIPTION OF THE PREFERRED EMBODIMENTS

A $ZrO_2.SiO_2$ film or $HfO_2.SiO_2$ film that can be used as a high dielectric gate insulating film having properties to substitute an $SiO_2$ film can be formed by oxygen reactive sputtering using a ZrSi or HfSi target.

The present invention provides a silicide target made of $MSi_{0.8-1.2}$ (M: Zr, Hf), a silicide target made of the single phase of MSi that contains no free Si, or a silicide target made of a mixed phase of at least two selected from MSi, $M_5Si_4$, and $MSi_2$.

The M/Si mole ratio required for a high dielectric gate insulating film is 1:1. To go so far, when a high dielectric gate insulating film is produced in a prescribed mole ratio, it can be produced from a mixed phase of a composition extremely deviated from the desired mole ratio, such as metal powder and Si powder or $MSi_2$ powder.

However, it has been known that a free Si phase takes significant part in the occurrence of metal silicide particles. In other words, it has been considered that when a sputtering target of a structure having a mixed phase of silicide and Si is sputtered, the irregularity of the surface caused by difference in sputtering rates between the Si phase and the metal silicide phase becomes prominent, resulting in increase in the number of particles.

According to the present invention, since free Si is eliminated, and the components are limited to three phases of MSi, $M_5Si_4$, or $MSi_2$ close to the desired mole ratio, the irregularity of the eroded surface caused by difference in sputtering rates can be minimized, and the occurrence of particles can be prevented.

The above-described silicide target for forming gate oxide films has a disadvantage of high brittleness. According to the present invention, the relative density is 99% or more, and the average crystal grain particle diameter is 30 $\mu$m or less, preferably 10 $\mu$m or less. Thereby, a non-brittle silicide target for forming gate oxide films with a transverse rupture strength of 200 or more MPa can be obtained.

If the relative density is less than 99%, and the average crystal grain particle diameter exceeds 30 $\mu$m, brittleness is lowered due to the shortage of density, resulting in poor machinability. Furthermore, increase in the number of particles is caused due to the breakdown and scattering of brittle crystals. Therefore the above-described ranges are preferable.

In order to manufacture a non-brittle silicide target for forming gate oxide films made of $MSi_{0.8-1.2}$ (M: Zr, Hf), hydrogenated metal (M) powder and Si powder are mixed in a mole ratio of 1:0.8 to 1:1.2, and the mixture is baked at a temperature between 600° C. and 800° C.

Although the use of Zr powder and Hf powder can be considered, there is a problem that Zr powder and Hf powder are highly susceptible to oxidation, and fine powder may cause spontaneous combustion.

Therefore, in order to prevent such spontaneous combustion, hydrogenated zirconium or hydrogenated hafnium is used. These hydrogenated powder and silicon powder are finely ground to an average particle diameter of 10 $\mu$m or less. The use of these fine powders enables highly densification in sintering.

Heating on the above-described sintering, dehydrogenation and silicide synthesis can be achieved. Dehydrogenation starts from 600° C. Sintering is carried out in a vacuum ($1\times10^{-4}$ to $1\times10^{-2}$ Torr), in a slight hydrogen atmosphere because of dehydrogenation.

As described above, in heating synthesis, by performing dehydrogenation and silicide synthesis simultaneously at a low temperature at which the growth of grains does not occur, the growth of grains can be prevented, the heated powder can be maintained fine, and the average crystal grain diameter can be 30 $\mu$m or less even after sintering. If the heated powder aggregates, coarse grains remain and the density lowers because the coarse grains are difficult to grind finely before sintering.

In the present invention, since the material powder is sintered at a low temperature, the growth of crystal grains can be prevented, and high densification can be achieved by sintering.

The densified silicide target of a relative density of 99% or more has a transverse rupture strength of 200 MPa or more.

The densified silicide target of the present invention has the effect to prevent the occurrence of particles caused by pores during sputtering, or the breakdown and scattering of the brittle structure.

EXAMPLES

The examples of the present invention will be described below. These examples are described only for exemplifying the present invention, and are not intended to limit the present invention. Therefore, the present invention includes other embodiments and variations that are included in the technical concept of the present invention.

Example 1

$ZrH_2$ powder and Si powder were mixed and heated to 800° C. in a vacuum to perform the dehydrogeneration reaction and the silicide synthesis reaction simultaneously, and the powder of synthesized $ZrSi_x$ (x=1.0) was yielded. This silicide powder was ground to obtain silicide powder that passes through a –200-mesh screen. It was confirmed from XRD that the silicide powder consists only of a $ZrSi_{1.0}$ phase.

The silicide powder was hot-pressed to produce a sintered body of a relative density of 99.2%, which was machined to fabricate a target of 300 mm in diameter and 6.35 mm in thickness. The average crystal grain diameter of the sintered target was 15 $\mu$m.

Sputtering was performed using thus fabricated target, and the number of particles on the 6-inch wafer was counted. The total number of particles of 0.2 $\mu$m or larger was 25.

Furthermore, no traces of broken $ZrSi_x$ phase were observed on the eroded surface of the target, and no irregularity of the surface due to difference in sputtering rate was observed. The transverse rupture strength of the target was 220 MPa.

Example 2

$ZrH_2$ powder and Si powder were mixed and heated to 800° C. in a vacuum to perform the dehydrogeneration reaction and the silicide synthesis reaction simultaneously, and the powder of synthesized $ZrSi_x$ (x=0.9) was yielded. This silicide powder was ground to obtain silicide powder that passes through a –200-mesh screen. It was confirmed from XRD that the silicide powder consists of two phases of $Zr_5Si_4$ and ZrSi phases.

The silicide powder was hot-pressed to produce a sintered body of a relative density of 99.3%, which was machined to fabricate a target of 300 mm in diameter and 6.35 mm in thickness. The average crystal grain diameter of the sintered target was 9 $\mu$m.

Sputtering was performed using thus fabricated target, and the number of particles on the 6-inch wafer was counted. The total number of particles of 0.2 $\mu$m or larger was 35.

Furthermore, no traces of broken $ZrSi_x$ phase were observed on the eroded surface of the target, and no irregularity of the surface due to difference in sputtering rate was observed. The transverse rupture strength of the target was 215 MPa.

Example 3

$ZrH_2$ powder and Si powder were mixed and heated to 800° C. in a vacuum to perform the dehydrogeneration reaction and the silicide synthesis reaction simultaneously, and two types of powder of synthesized $ZrSi_x$ (x=0.8 and x=1.2) were yielded.

These silicide powders were ground to obtain silicide powders that pass through a −200-mesh screen, and mixed to have a mole ratio of Si/Zr=1.0. It was confirmed from XRD that the silicide powder consists of three phases of $Zr_5Si_4$, ZrSi, and $ZrSi_2$ phases.

The silicide powder was hot-pressed to produce a sintered body of a relative density of 99.0%, which was machined to fabricate a target of 300 mm in diameter and 6.35 mm in thickness. The average crystal grain diameter of the sintered target was 25 μm.

Sputtering was performed using thus fabricated target, and the number of particles on the 6-inch wafer was counted. The total number of particles of 0.2 μm or larger was 30.

Furthermore, no traces of broken $ZrSi_x$ phase were observed on the eroded surface of the target, and no irregularity of the surface due to difference in sputtering rate was observed. The transverse rupture strength of the target was 205 MPa.

Comparative Example 1

$ZrH_2$ powder and Si powder were mixed and heated to 1,200° C. in a vacuum to perform the dehydrogeneration reaction and the silicide synthesis reaction simultaneously, and the powder of synthesized $ZrSi_x$ (x=1.0) was yielded. This silicide powder was ground to obtain silicide powder that passes through a −200-mesh screen. It was confirmed from XRD that the silicide powder consists only of the ZrSi phase.

The silicide powder was hot-pressed to produce a sintered body of a relative density of 89.0%, which was machined to fabricate a target of 300 mm in diameter and 6.35 mm in thickness. The average crystal grain diameter of the sintered target was 100 μm.

Sputtering was performed using thus fabricated target, and the number of particles on the 6-inch wafer was counted. The total number of particles of 0.2 μm or larger was 95.

Furthermore, traces of broken $ZrSi_x$ phase obviously considered to be the source of dust were observed on the eroded surface of the target. Although no irregularity of the surface due to difference in sputtering rate was observed, a large number of nodules were observed. The transverse rupture strength of the target was 150 MPa.

Comparative Example 2

$ZrH_2$ powder and Si powder were mixed and heated to 1200° C. in a vacuum to perform the dehydrogeneration reaction and the silicide synthesis reaction simultaneously, and two types of powders of synthesized $ZrSi_x$ (x=0.6 and x=2.2) were yielded. These silicide powders were ground to obtain silicide powders that pass through a −200-mesh screen, and mixed to have a mole ratio of Si/Zr=1.0. It was confirmed from XRD that the silicide powder consists of three phases of $Zr_5Si_3$, $ZrSi_2$, and Si phases.

The silicide powder was hot-pressed to produce a sintered body of a relative density of 93%, which was machined to fabricate a target of 300 mm in diameter and 6.35 μm in thickness. The average crystal grain diameter of the sintered target was 100 μm.

Sputtering was performed using thus fabricated target, and the number of particles on the 6-inch wafer was counted. The total number of particles of 0.2 μm or larger was 120.

Furthermore, traces of broken $ZrSi_x$ phase obviously considered to be the source of dust were observed on the eroded surface of the target. The irregularity of the surface due to difference in sputtering rate was observed, and a large number of nodules were also observed. The transverse rupture strength of the target was 165 MPa.

The results of the above-described Examples 1 to 3 and Comparative Examples 1 and 2 are shown in Table 1.

As obviously seen in Table 1, the average crystal grain diameters of all the targets of Examples 1 to 3 is 30 μm or less, and the relative density is 99% or more. The number of particles is 35 or less, no traces of broken $ZrSi_x$ phase were observed, and no irregularity of the surface due to difference in sputtering rate was observed.

The transverse rupture strengths of the targets were as high as 220 MPa, 215 MPa, and 205 MPa.

On the other hand, the average crystal grain diameter of Comparative Example 1 was as large as 100 μm, and the relative density was a slow as 89%. As a result, the number of particles was 95, and traces of broken $ZrSi_x$ phase were observed. Although no irregularity of the surface due to difference in sputtering rate was observed, a large number of nodules were observed. The transverse rupture strength of the target was as low as 150 MPa, which were unsatisfactory results.

Also, the average crystal grain diameter of Comparative Example 2 was as large as 100 μm, and although the relative density was as high as 93%, free Si was present. As a result, the number of particles was 120, and traces of broken $ZrSi_x$ phase were observed. The irregularity of the surface due to difference in sputtering rate was observed, and a large number of nodules were observed. The transverse rupture strength of the target was as low as 165 MPa, which were unsatisfactory results.

As described above, the superiority of the embodiments according to the present invention is obvious, and it is known to have excellent properties.

TABLE 1

|  | Crystal grain diameter of the target | Relative density of the target | Phase of the target | Number of particles | Trace of broken $ZrSi_x$ phase | Irregularity of eroded surface | Occurrence of nodules | Transverse rupture strength of the target |
|---|---|---|---|---|---|---|---|---|
| Example 1 | 15 μm | 99.2% | $ZrSi_{1.0}$ | 25 | Not observed | Not observed | — | 220 MPa |
| Example 2 | 9 μm | 99.3% | $Zr_5Si_4$, ZrSi | 35 | Not observed | Not observed | — | 215 MPa |
| Example 3 | 25 μm | 99.0% | $Zr_5Si_4$, ZrSi, $ZrSi_2$ | 30 | Not observed | Not observed | — | 205 MPa |

TABLE 1-continued

|  | Crystal grain diameter of the target | Relative density of the target | Phase of the target | Number of particles | Trace of broken $ZrSi_x$ phase | Irregularity of eroded surface | Occurrence of nodules | Transverse rupture strength of the target |
|---|---|---|---|---|---|---|---|---|
| Comparative Example 1 | 100 μm | 89.0% | ZrSi | 95 | Observed | Not observed | Many observed | 150 MPa |
| Comparative Example 2 | 100 μm | 93.0% | $Zr_5Si_3$, $ZrSi_2$, Si | 120 | Observed | Observed | Many observed | 165 MPa |

(The number of particles shown in Table 1 is the number of particles of 0.2 μm or larger observed on a 6-inch wafer.)

According to the present invention, there is provided a non-brittle silicide target for forming a gate oxide film made of $MSi_{0.8-1.2}$ (M: Zr, Hf), suitable for forming a $ZrO_2.SiO_2$ film or $HfO_2.SiO_2$ film that can be used as a high dielectric gate insulating film having properties to substitute an $SiO_2$ film.

The silicide target can inhibit the growth of crystal grains, and can be formed to have high density. Furthermore, the densified silicide target of a relative density of 99% or more has a transverse rupture strength of 200 MPa or higher.

Furthermore, the highly densified silicide target of the present invention has a significant effect to prevent the occurrence of particles caused by pores during sputtering, and the occurrence of particles caused by the breakdown and scattering of brittle structures.

What is claimed is:

1. A method for manufacturing a non-brittle silicide target for forming a gate oxide film consisting of $MSi_{0.8-1.2}$ (M:Zr, Hf), comprising the steps of:

mixing hydrogenated metal (M) powder and Si powder in a mole ratio of 1:0.8 to 1:1.2, and heating and baking the mixture at a temperature between 600° C. and 800° C. dehydrogenation and silicide synthesis being carried out during baking.

2. A sputtering target for sputtering a thin film, comprising a silicide target for sputtering a gate oxide film made of $HfSi_{0.8-1.2}$, no free Si being present in said silicide target, said silicide target being made of a single phase of HfSi, and said silicide target being non-brittle having a transverse rupture strength of at least 200 MPa.

3. A sputtering target according to claim 2, wherein said silicide target has a relative density of at least 99%.

4. A sputtering target according to claim 3, wherein said silicide target has an average crystal grain diameter of no more than 30 μm.

5. A sputtering target according to claim 4, wherein said silicide target has an average crystal grain diameter of no more than 10 μm.

6. A sputtering target for sputtering a thin film, comprising a silicide target for sputtering a gate oxide film made of $HfSi_{0.8-1.2}$, no free Si being present in said silicide target, said silicide target being made of a mixed phase including at least two selected from the group consisting of HfSi, $Hf_5Si_4$, and $HfSi_2$, and said silicide target being non-brittle having a transverse rupture strength of at least 200 MPa.

7. A sputtering target according to claim 6, wherein said silicide target has a relative density of at least 99%.

8. A sputtering target according to claim 7, wherein said silicide target has an average crystal grain diameter of no more than 30 μm.

9. A sputtering target for sputtering a thin film, comprising a silicide target for sputtering a gate oxide film made of $ZrSi_{0.8-1.2}$, no free Si being present in said silicide target, said silicide target being made of a single phase of ZrSi, and said silicide target being non-brittle having a transverse rupture strength of at least 200 MPa.

10. A sputtering target according to claim 9, wherein said silicide target has a relative density of at least 99%.

11. A sputtering target according to claim 10, wherein said silicide target has an average crystal grain diameter of no more than 30 μm.

12. A sputtering target according to claim 11, wherein said silicide target has an average crystal grain diameter of no more than 10 μm.

13. A sputtering target for sputtering a thin film, comprising a silicide target for sputtering a gate oxide film made of $ZrSi_{0.8-1.2}$, no free Si being present in said silicide target, said silicide target being made of a mixed phase including at least two selected from the group consisting of ZrSi, $Zr_5Si_4$, and $ZrSi_2$, and said silicide target being non-brittle having a transverse rupture strength of at least 200 MPa.

14. A sputtering target according to claim 13, wherein said silicide target has a relative density of at least 99%.

15. A sputtering target according to claim 14, wherein said silicide target has an average crystal grain diameter of no more than 30 μm.

16. A sputtering target according to claim 15, wherein said silicide target has an average crystal grain diameter of no more than 10 μm.

* * * * *